United States Patent [19]

Saito et al.

[11] Patent Number: 4,924,293

[45] Date of Patent: May 8, 1990

[54] SEMICONDUCTOR INTEGRATED CIRCUIT DEVICE

[75] Inventors: Yoshikazu Saito, Takasaki; Yoshiaki Yazawa, Hitachi, both of Japan

[73] Assignee: Hitachi, Ltd., Tokyo, Japan

[21] Appl. No.: 348,117

[22] Filed: May 4, 1989

Related U.S. Application Data

[63] Continuation of Ser. No. 866,923, May 27, 1986, abandoned.

[30] Foreign Application Priority Data

May 24, 1985 [JP] Japan .................................. 60-110319
May 24, 1985 [JP] Japan .................................. 60-110364

[51] Int. Cl.[5] .................... H01L 23/48; H01L 29/46; H01L 29/54; H01L 29/62
[52] U.S. Cl. ....................................... 357/71; 357/43; 357/67
[58] Field of Search ................. 357/71, 41, 43, 67

[56] References Cited

U.S. PATENT DOCUMENTS 4,314,268 2/1982 Yoshioka et al. ...................... 357/48
4,437,135 3/1984 Ogata et al. ...................... 357/23.13
4,607,274 8/1986 Yoshitake ............................ 357/42

Primary Examiner—Robert S. Macon
Attorney, Agent, or Firm—Antonelli, Terry & Wands

[57] ABSTRACT

A semiconductor integrated circuit device in which a wiring layer which supplies a predetermined operation voltage to an electronic circuit has a decreased parasitic impedance. The wiring layer is constituted by a first path and a second path that are connected in parallel between a connection pad and the electronic circuit, or a second wiring layer that constitutes an AC loop is formed close to the first wiring layer which supplies the operation voltage, or the above-mentioned two structures are employed in combination.

32 Claims, 7 Drawing Sheets

SEMICONDUCTOR INTEGRATED CIRCUIT DEVICE

This application is a continuation of application Ser. No. 06/866,923, filed on May 27, 1986, now abandoned.

BACKGROUND OF THE INVENTION

The present invention relates to a wiring technique, and, more specifically, to a technique that can be effectively utilized for forming a wiring layer to supply an operation voltage to the electronic circuitry in a semiconductor integrated circuit device.

A semiconductor integrated circuit is formed by a combination of many electronic circuits each of which is supplied with an operation voltage (or often referred to as power source voltage) through a wiring layer (or often referred to as power source wiring).

The area of a semiconductor substrate in which a semiconductor integrated circuit is formed, is ever increasing accompanying the trend toward constructing semiconductor integrated circuits having larger scales and larger capacities. Therefore, the length of the wiring layer for supplying the operation voltage is inevitably increased, resulting in an increase in the parasitic impedance which is the sum of the parasitic inductive and the parasitic resistance.

Study has also been vigorously directed toward increasing the operation speed of the semiconductor integrated circuit devices, and a technique has been developed to charge and discharge, at high speeds, the capacitive load of a signal propagation path in the semiconductor integrated circuit. When the electronic circuit is operated, therefore, a large current flows into the wiring layer which has a large parasitic impedance, and the operation voltage applied to the wiring layer undergoes variation due to the parasitic impedance. Variation in the operation potential causes other electronic circuits to operate erroneously. For example, if amongst the other electronic circuits there is included a complementary (MOS(C-MOS)) inverter circuit that properly operates an operation voltages of 5 volts and zero volt, the following error develops in the operation.

If now the operation voltage of 5 volts drops down to 4.2 volts due to the parasitic impedance in the wiring layer, a logic input threshold voltage of the CMOS inverter circuit becomes lower than a predetermined value. In the worst case, therefore, an input signal of the low level will be erroneously determined to be an input signal of the high level. If a zero-volt operation voltage changes to 0.8 volts due to the parasitic impedance in the wiring layer, the logic input threshold voltage of the CMOS inverter circuit becomes greater than a predetermined value, and an input signal of the high level will be erroneously determined to be an input signal of the low level.

SUMMARY OF THE INVENTION

The inventors have directed their attention toward decreasing the impedance that is parasitic on a wiring layer (power source wiring) which supplies an operation voltage (power source voltage) to the electronic circuits, and have discovered the following results and characteristics described below.

In order to restrain the variation in the power source voltage, one can increase the width of the power source wiring. The resistance component in the parasitic impedance decreases if the width of the power source wiring is increased. However, the self-inductance component in the parasitic impedance of the power source wiring does not significantly decrease since it has characteristics as given by the following equation. That is, if the length of the wiring in denoted by l, and the width and thickness thereof are denoted by d and a, respectively, the self-inductance of the wiring having a rectangular shape in cross section is given by the equation (1), $$L = 2l\left(\ln 2\left(\frac{l}{R}\right) - 1 + \left(\frac{R}{l}\right)\right) \quad (1)$$

where R is a constant determined by the sectional shape of the wiring, and is given by the following equation (2) when the wiring has a rectangular shape in cross section, $$R = 0.2235(a+d) \quad (2)$$

If l=1, a=1 are substituted for the above equations (1) and (2), and if the width d is changed, there are obtained $L \approx 1,9$ with d=1, and $L \approx 1,4$ with d=2. The self-inductance of the wiring does not readily decrease to one-half even if the width d of the wiring is doubled. It will therefore be recognized that the self-inductance of the power source wiring is not adequately decreased even if the width of the wiring is increased.

The present invention was accomplished in view of the above-mentioned facts.

The object of the present invention is to provide a power source wiring system which restrains the variation in the power source voltage caused by the parasitic inductance of the power source line, and which prevents the electronic circuits from erroneously operating.

The above and other objects as well as novel features of the present invention will become apparent from the description of the specification and the accompanying drawings.

Representative examples of the invention disclosed in this application are briefly described below.

(a) A wiring layer for supplying an operation voltage to an electronic circuit that operates on a predetermined operation voltage, is constituted by a first path and a second path connected in parallel between a connection pad and the electronic circuit on a semiconductor substrate. The self-inductance of the whole wiring layer decreases owing to the fact that the self-inductance of the whole wiring layer varies in inverse proportion to the sum of the inverse numbers of the self-inductance parasitic components on the first and second paths.

In order to decrease the mutual inductance between the first path and the second path, the wiring layer is formed on the main surface of (a rectangular-shaped square) semiconductor substrate along the four sides thereof. Since a gap is maintained between the first path and the second path, the induction field induced by an electric current that flows into the first path (or the second path) affects little the second path (or the first path). Therefore, the mutual inductance decreases between the first path and the second path.

(b) A first wiring layer is formed so as to supply the operation voltage to the electronic circuit that operates on a predetermined operation voltage, and a second wiring layer is provided near the first wiring layer. The second wiring layer forms an AC loop. Since the AC loop formed by the second wiring layer exists close to the first wiring layer, an electric current flows in the AC loop due to a counterelectromotive voltage induced by the current that flows in the first wiring layer. The current flowing in the AC loop is nearly equal to the current that flows in the first wiring layer, but the direction of flow is opposite, so that the induction field by the currents are cancelled by each other. The electric current produced by the counterelectromotive voltage that is allowed to flow in the AC loop, helps greatly to decrease the magnetic flux that intersects the first wiring layer. Moreover, the apparent self-inductance of the first wiring layer can be decreased since the drop in the operation voltage caused by the self-inductance of the first wiring layer is greatly reduced.

(c) By combining the above-mentioned facts (a) and (b) together, the self-inductance and the mutual inductance of the wiring layer can be decreased, and whereby the apparent self-inductance can be decreased, making it possible to decrease the parasitic impedance of the wiring layer. When a third path is provided close to either the first path or the second path, furthermore, a second wiring layer should be provided between the first path and the third path (or between the second path and the third path) so that it works as a magnetic shielding member. That is, the magnetic shielding is obtained between the first path and the third path (or between the second path and the third path), so that the mutual inductance is further decreased between the first path and the second path. When the third path does not exist, the second wiring layer may be provided between the first path and the second path.

DESCRIPTION OF THE PREFERRED EMBODIMENTS

FIG. 1 schematically illustrates a power source wiring system in a semiconductor integrated circuit according to the present invention.

Figure 1A:
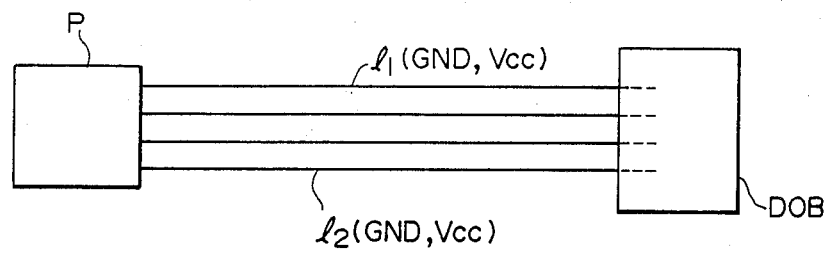
FIGS. 1(A), 1(B), 1(C), 1(D) and 1(E) are diagrams which schematically illustrate the present invention.

According to the present invention as shown in FIG. 1(A), a wiring layer (power source line) is divided into two, i.e., divided into a first path $l_1$ and a second path $l_2$ to supply a power source voltage to the output buffer circuit DOB, the wiring layer stretching from a power source bonding pad P that is a connection pad to which is applied a power source voltage GND (or $V_{CC}$) like ground potential for operating the electronic circuit to an output buffer circuit DOB into which a particularly large current flows. If the self-inductance only is taken into consideration, the inductance of the wiring layer does not change so much depending upon the width of the wiring layer as will be understood from the equation (1) mentioned earlier. In a semiconductor integrated circuit, the self-inductance can be treated as an impedance. If the mutual inductance M is neglected, therefore, the wiring layer can be divided into two, i.e., divided into the first path and the second path as shown in FIG. 1(A), and the two paths are connected in parallel between the pad P and the electronic circuit, so that the inductance of the power source line as a whole can be roughly halved. If the self-inductances of the first and second paths $l_1$, $l_2$ are denoted by $L_1$ and $L_2$, then the total inductance $L_{total}$ is given by $$\frac{1}{L_{total}} = \frac{1}{L_1} + \frac{1}{L_2}$$

If the inductances $L_1$ and $L_2$ are equal to each other, the total inductance $L_{total}$ can be decreased to nearly one-half, i.e., $L_{total} = L_1/2$.

With the first path $l_1$ and the second path $l_2$ running close to each other and in parallel with each other, as shown in FIG. 1(A), however, the mutual inductances M caused by the mutually inducing action between the two wirings cannot be neglected at all.

Figure 1B:
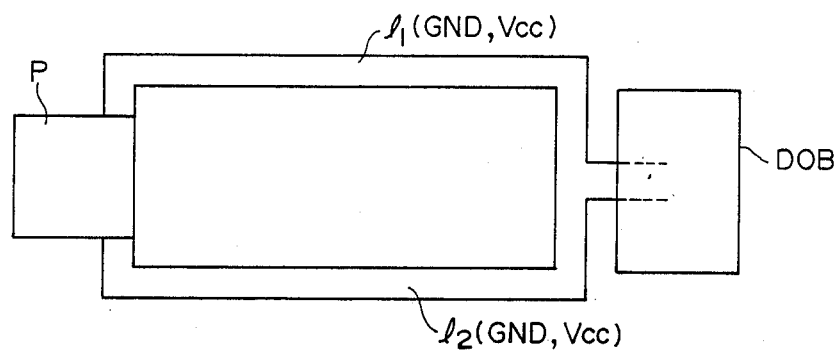

On the other hand, if the first and second paths $l_1$, $l_2$ are separated away from each other as shown in FIG. 1(B), the magnetic field formed around one path $l_1$ (or $l_2$) by a current that flows therethrough does not affect the other path $l_2$ (or $l_1$). Therefore, the mutual inductance between the first path $l_1$ and the second path $l_2$ can be reduced to almost zero, and the inductance of the wiring layer as a whole can be nearly halved.

The first path $l_1$ and the second path $l_2$ are formed on the main surface of a square semiconductor substrate along the four sides thereof.

Figure 1C:
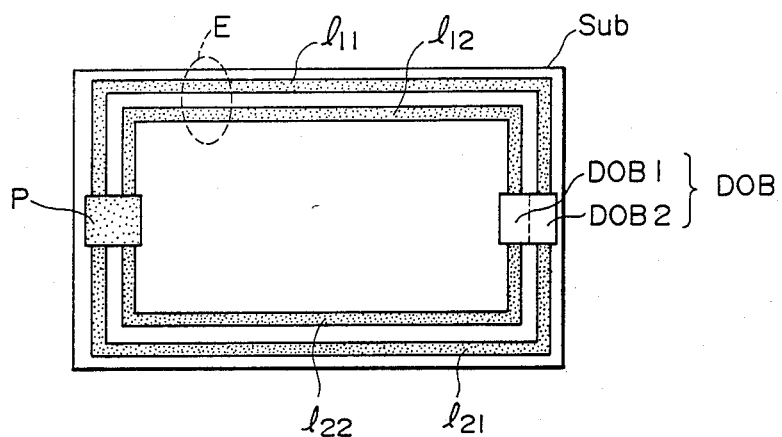

FIG. 1(C) illustrates the state where a first path $l_{11}$, a second path $l_{21}$, a third path $l_{12}$ and a fourth path $l_{22}$ are formed on the main surface of a square semiconductor substrate Sub along the four sides thereof. On the main surface of the semiconductor substrate Sub are formed an output buffer circuit DOB which is an electric circuit that operates on a predetermined operation voltage, and a power source bonding pad P that serves as a connection pad. This arrangement should be employed when there are, for example, two output buffer circuits DOB.

Figure 1D:
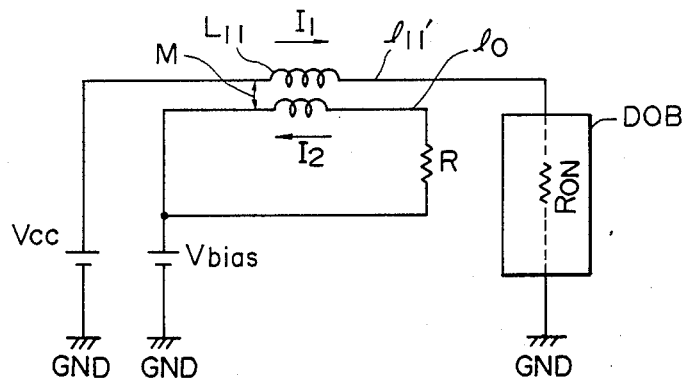

FIG. 1(D) is a diagram which illustrates the principle of another method of reducing the self-inductance. There are shown a first wiring layer $l_{11}'$ having a parasitic self-inductance $L_{11}$ for supplying an operation voltage $V_{CC}$ to the output buffer circuit DOB which is an electronic circuit that operates on a predetermined operation voltage ($V_{CC}$, GND), and a second wiring layer $l_0$ having a parasitic self-inductance $L_0$ formed close to the first wiring layer $l_{11}'$. The second wiring layer $l_0$ forms an AC loop.

As the output buffer circuit DOB operates and a current $I_1$ flows through the first wiring layer $l_{11}'$, a magnetic field generated by the current $I_1$ acts upon the AC loop which is formed close to the first wiring layer, whereby a current flows in the AC loop in a direction indicated by an arrow in the drawing due to a counterelectromotive force.

If the self-inductance of the second wiring layer $l_0$ is denoted by $L_0$, and the mutual inductance between the first wiring layer $l_{11}'$ and the conductive layer $l_0$ is denoted by M, the following relations (3) and (4) generally hold $$L_{11} \cdot L_0 \geq M^2 \quad (3)$$

$$k = \frac{M}{\sqrt{L_{11} \cdot L_0}} \quad (0 < k < 1) \quad (4)$$

where k is a coupling coefficient, and wherein a strong coupling is obtained when k is close to 1, and a weak coupling is obtained when k is close to zero.

Since the first wiring layer $l_{11}'$ and the second wiring layer $l_0$ are formed adjacent to each other, the coupling coefficient k is very close to 1, and a relation $L_{11} \cdot L_0 \approx M^2$ can be approximated.

On the other hand, the magnetic flux $\phi_1$ that intersects the first wiring layer $l_{11}$ is given by the following equation, $$\phi_1 = L_{11} \cdot I_1 - M \cdot I_2$$

If now $L_{11} = M$, then the magnetic flux $\phi_1$ becomes nearly zero, and the counterelectromotive force $(e_i = -d\phi_1/dt)$ of the first wiring layer $l_{11}'$ produced by the magnetic flux $\phi_1$ becomes nearly zero. Therefore, the apparent self-inductance of the first wiring layer $l_{11}'$ decreases.

To obtain a relation $L_{11} = M$, the wiring layers should be formed as close to each other as possible, and the current $I_1$ and the current $I_2$ should be selected to be nearly equal to each other. For this purpose, the parasitic resistance R in the AC loop should be selected to be nearly equal to the resistance $R_{ON}$ of the output transistor of when it is rendered conductive, the output transistor being contained in the output buffer circuit DOB to produce a signal that will be sent to an external unit.

The AC loop is formed such that the current $I_2$ is allowed to flow positively. In order to prevent the DC power from being consumed, furthermore, no DC voltage difference is contained in the second wiring layer $l_0$. As shown in FIG. 1(D), therefore, the bias potential $V_{bias}$ of the AC loop which consists of the second wiring layer $l_0$ is equal to the power source potential $V_{CC}$ or GND for the internal circuits, or is equal to a reference potential $V_{ref}$. Or, the AC loop may be maintained under the floating condition, without applying a bias potential $V_{bias}$.

Figure 1E:
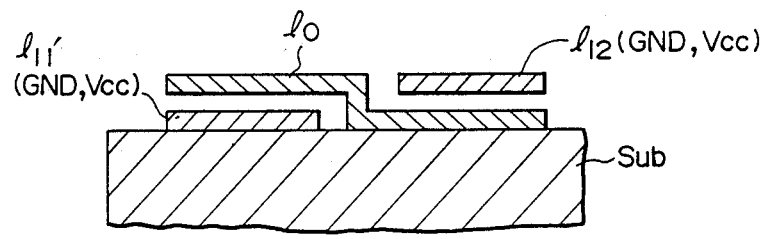

FIG. 1(E) shows the case where there are employed the method of decreasing the self-inductance shown in FIG. 1(C) and the method of decreasing the apparent self-inductance shown in FIG. 1(D). More specifically FIG. 1(E) is a section view which schematically illustrates a portion E that is surrounded by a dotted line in FIG. 1(C).

In FIG. 1(C), the first path $l_{11}$ and the third path $l_{12}$ are formed in parallel adjacent to each other on the main surface of the semiconductor substrate along one side thereof. Therefore, the mutual inductance cannot be neglected between the first path $l_{11}$ and the third path $l_{12}$, or between the second path and the fourth path. As shown in FIG. 1(E), therefore, a second wiring layer $l_0$ is provided between the first path $l_{11}$ and the third path $l_{12}$. The second wiring layer $l_0$ works as a magnetic shielding plate between the first path $l_{11}$ and the third path $l_{12}$, and further works as an AC loop for decreasing the apparent self-inductance of the first pat $l_{11}$ and the third path $l_{12}$ that are the first wiring layers. As will be understood from FIG. 1(E), the first wiring layers $l_{11}$, $l_{12}$ and the second wiring layer $l_0$ are solidly laminated at least partially. In practice, the first wiring layer (first path) $l_{11}$ and a part of the second wiring layer $l_0$ are formed by a first aluminum wiring layer, and the first wiring layer (second path) $l_{12}$ and another part of the second wiring layer $l_0$ are formed by a second aluminum wiring layer. Although only the first path and the third path were described above, the same also holds true for the second path and the fourth path. For the purpose of easy explanation, furthermore, the above description has dealt with the first, second and third paths of which the positions were as shown in FIG. 1(C). The positions, however, need not be limited thereto only but may be modified in a variety of ways. For instance, the first path and the second path may be formed close to each other.

A high-speed semiconductor memory device will now be described to which the present invention is adapted. Applicants have directed their emphasis so as to realize a static RAM that consumes reduced amounts of electric power and operates at high speeds, such as the technology (hereinafter referred to as bipolar CMOS mixed technology) developed at the facilities of the assignee constituting a static RAM using both bipolar transistors and MOS transistors. A brief description of such is described below. That is, in an address circuit and a timing circuit in a semiconductor memory, bipolar transistors are used as output transistors that electrically charge and discharge signal lines of a long distance and as output transistors having large fan out. Logic circuits are constituted by CMOS circuits to perform logical processes such as inversion, non-inversion, NAND and NOR. The logic circuit constituted by the CMOS circuit consumes a reduced amount of electric power, and produces a signal that will be transmitted onto a long-distance signal line via a bipolar output transistor having a small output impedance. Since the output signal is transmitted onto the signal line using a bipolar output transistor having a small output impedance, dependence of the signal propagation delay time upon the stray capacity of the signal line can be decreased. Accordingly, there is obtained a semiconductor memory which consumes a small amount of electric power yet maintaining a high operation speed.

Figure 8:
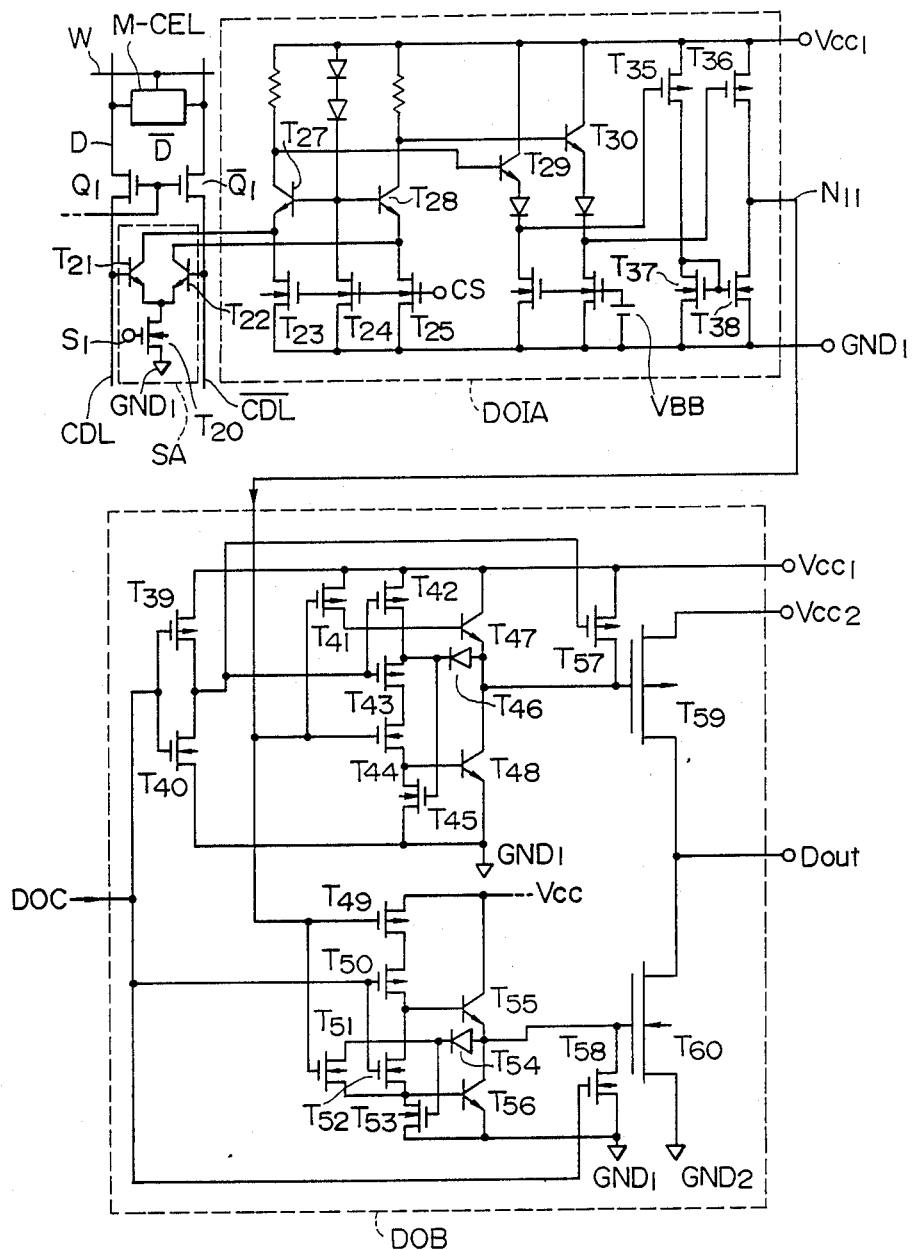
FIG. 8 is a diagram showing a portion of the circuit of the static RAM to which the present invention is adapted.

FIG. 8 shows a portion of the static RAM circuit constituted by the aforementioned bipolar CMOS mixed technology that was developed by the assignee of the present application.

FIG. 8 shows internal circuits such as memory cells M that store the data, a sense amplifier SA, a data output intermediate amplifier DOIA which amplifies the output of the sense amplifier, and a data output buffer circuit DOB which is an electronic circuit that operates on a predetermined operation voltage.

A pair of complementary data lines D, $\overline{D}$ are connected to a memory cell M-CEL, the other ends of the complementary data lines being connected to common data lines CDL, $\overline{CDL}$ via Y-select switches (column switches) $Q_1$, $\overline{Q_1}$ in the Y-switch train. By detecting the change of potential that complementarily appears on the common data lines CDL, $\overline{CDL}$ by the read sense circuit SA, therefore, the data stored in a selected memory cell M-CEL can be read out. The select switches $Q_1$, $\overline{Q_1}$ in the Y-select switch train are constituted by MOS field-effect transistors. When not selected, i.e., when effective address data are not input, the Y-select switches are all rendered off (nonconductive).

The sense amplifier SA consists of a pair of emitter-coupled bipolar differential transistors $T_{21}$, $T_{22}$, and a constant current source MISFET $T_{20}$. If a suitable select control signal S1 is applied to the gate electrode of the constant current source MISFET $T_{20}$, the sense amplifier SA performs the sensing operation.

The data output intermediate amplifier DOIA performs the amplification operation if an internal chip select signal CS of a high level is applied from a timing generating circuit to the gate electrodes of constant current sources MISFETs $T_{23}$ to $T_{25}$ of the data output intermediate amplifier DOIA.

Therefore, the output signal of the sense amplifier SA is transmitted to an output node $N_{11}$ of the data output intermediate amplifier DOIA via base-grounded transistors $T_{27}$, $T_{28}$, emitter-follower transistors $T_{29}$, $T_{30}$, and output MISFETs $T_{35}$ to $T_{38}$. A data output buffer control signal DOC produced from the timing generating circuit is supplied to the data output buffer circuit DOB.

The data output buffer circuit DOB receives, as an input signal, an output signal DOC produced by the timing generating circuit which is an internal circuit, and performs the switching operation in response to the input signal DOC. Depending upon the data output buffer control signal DOC, furthermore, the data output buffer circuit DOB sends an output signal to an external output terminal in response to an output signal of the data output intermediate amplifier DOIA which is an internal circuit.

The data output buffer circuit DOB which is a circuit of the output stage has an output transistor which produces an output signal, and a drive circuit for driving the output transistor. The drive circuit is comprised of a pure CMOS inverter consisting of MISFETs $T_{39}$ and $T_{40}$, a quasi-CMOS 2-input NAND circuit consisting of transistors $T_{41}$ to $T_{48}$, a quasi-CMOS 2-input NOR circuit consisting of transistors $T_{49}$ to $T_{56}$, a p-channel switching MISFET $T_{57}$, and an n-channel switching MISFET $T_{58}$. The output transistors consist of MOSFETs such as a p-channel output MISFET $T_{59}$ and an n-channel output MISFET $T_{60}$.

When the data output buffer control signal DOC assumes the high level, the switching MISFETs $T_{57}$ and $T_{58}$ are turned on, and whereby the output MISFETs $T_{59}$ and $T_{60}$ are simultaneously turned off. Therefore, the output $D_{out}$ of the data output buffer circuit DOB assumes a high impedance (floating) state.

At the time of reading the data stored in the RAM cells, the data output buffer control signal DOC assumes the low level, the switching MISFETs $T_{57}$ and $T_{58}$ are rendered off, gate electrodes of the output MISFETs $T_{59}$ and $T_{60}$ are controlled by the outputs both of the quasi-CMOS 2-input NOR circuit in response to the signal level of the output node $N_{11}$ of the data output intermediate amplifier DOIA, and effective data is obtained as an external output signal from the external output terminal $D_{out}$.

To decrease the ON resistance of the output MISFETs $T_{59}$, $T_{60}$ to a small value (about 10 ohms) when they are conductive, the channel width W of these MISFETs is selected to be a very large value. That is, the output transistors $T_{59}$ and $T_{60}$ have a larger than that of other transistors in the internal circuits and in the output circuit. Therefore, the MISFETs $T_{59}$ and $T_{60}$ have very large gate capacities. Here, however, the output portion of the quasi-CMOS 2-input NAND circuit is constituted by bipolar output transistors $T_{47}$ and $T_{48}$, and the output portion of the quasi-CMOS 2-input NOR circuit is constituted by bipolar output transistors $T_{55}$ and $T_{56}$. Therefore, the gate capacities of these output MISFETs $T_{59}$ and $T_{60}$ are electrically charged and discharged at high speeds.

The base electrodes of bipolar transistors $T_{47}$, $T_{48}$ in the output portion of the quasi-CMOS 2-input NAND circuit are driven by the outputs of MISFETs $T_{41}$, $T_{42}$, $T_{43}$, $T_{44}$ and $T_{45}$ of the CMOS circuit in the drive circuit, and bipolar transistors $T_{55}$ and $T_{56}$ in the output portion of the quasi-CMOS 2-input NOR circuit are driven by the outputs of MISFETs $T_{49}$, $T_{50}$, $T_{51}$, $T_{52}$ and $T_{53}$ of the CMOS circuit in the drive circuit, so that the semiconductor integrated circuit device consumes the electric power in small amounts.

The static RAM constituted by the aforementioned bipolar CMOS mixed technology will now be described.

Figure 2:
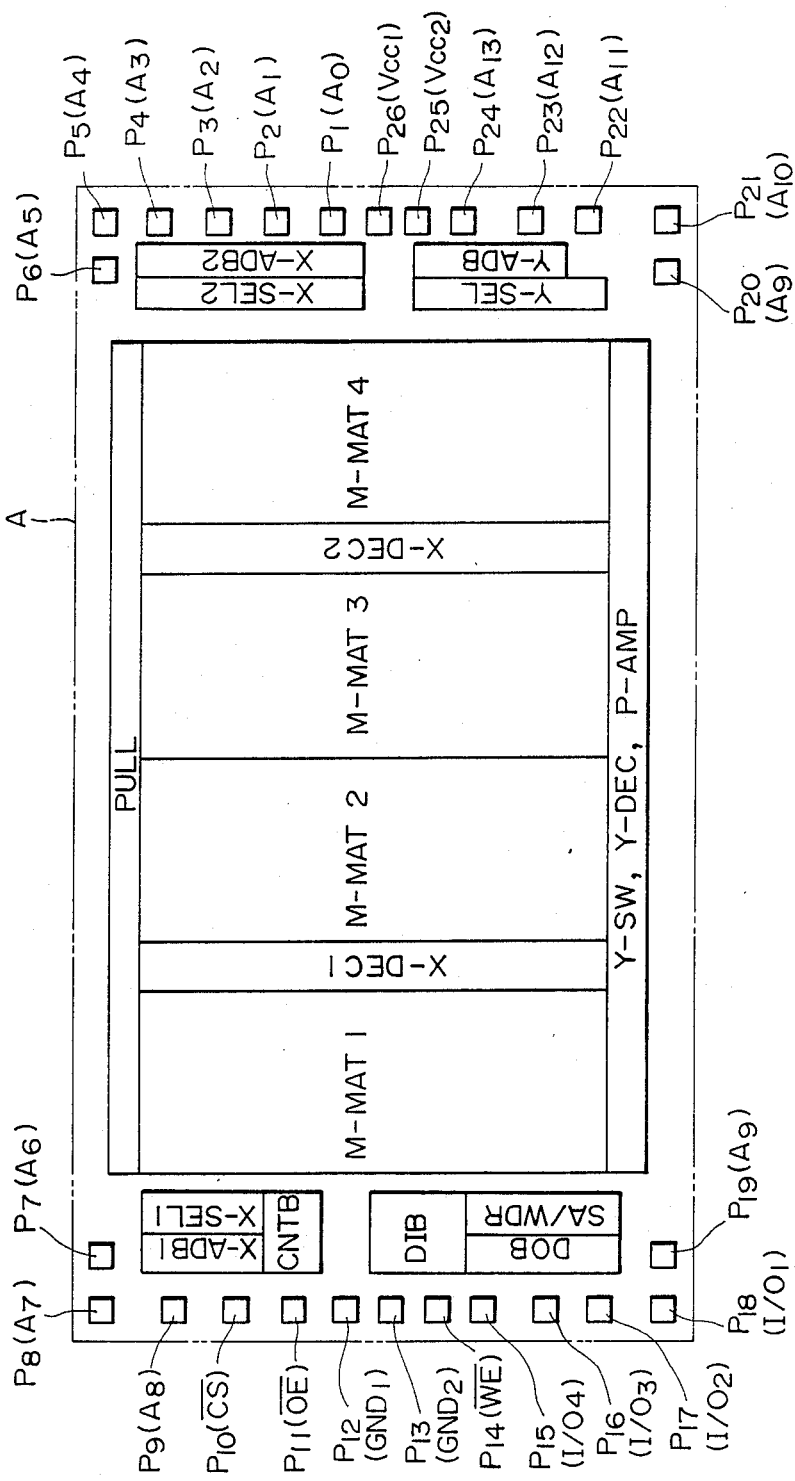
FIG. 2 is a diagram which illustrates the layout structure of a static RAM that is a semiconductor integrated circuit to which the present invention is adapted.

FIG. 2 shows an embodiment of layout of the whole static RAM chip which is a semiconductor integrated circuit to which the present invention is adapted. In the static RAM of this embodiment, though not specifically limited, the memory array is constituted by MISFETs, and the peripheral circuits are constituted by bipolar transistors and CMOS circuits.

The circuit blocks surrounded by a dot-dash line A are formed on a single semiconductor chip such as a single crystalline silicon substrate by the semiconductor integrated circuit technology.

In the static RAM of this embodiment, though not specifically limited, the memory array portion is divided into four memory mats M-MAT1 to M-MAT-4 each of which containing memory cells of the widely known high-resistance load type in the form of a matrix consisting of, for example, 128 rows × 128 columns.

X-decoders X-DEC1 and X-DEC2, each having word line select drive circuits on both sides thereof, are arranged between the memory mat M-MAT1 and the memory mat M-MAT2, and between the memory mat M-MAT3 and the memory mat M-MAT4.

On one side (lower side in FIG. 2) of the memory mats M-MAT1 to M-MAT4 are arranged a group of column switches Y-SW to connect data line pairs arranged in the mats to the common data line pairs, a Y-decoder Y-DEC which selectively renders conductive a pair of column switches one by one for each of the mats, the pair of column switches being corresponded to an address signal in the Y-system among the group of column switches, and a preamplifier P-AMP. A train of pull-up MOSFETs PULL are arranged on the upper side of the memory mats MAT1 to M-MAT4, and are connected to the data lines.

On both sides of the memory mats M-MAT1 to M-MAT4 are arranged X-address buffer circuits X-ADB1, X-ADB2 and a Y-address buffer circuit Y-ADB that form internal address signals for the X-decoders X-DEC1, X-DEC2 and for the Y-decoder Y-DEC respectively in response to address signals $A_0$ to $A_{13}$ supplied from an external unit, and a further arranged X-system select circuits X-SEL1, X-SEL2 and a Y-system select circuit Y-SEL that have address decoding functions.

On the left side of the memory mats M-MAT1 to M-MAT4 are further provided an input buffer CNTB for a variety of control signals $\overline{CS}$, $\overline{OE}$, $\overline{WE}$, a data input buffer DIB, a sense amplifier SA, a write driver WDR, and a data output buffer DOB. In this embodiment, there are provided four output buffers, and each of the mats M-MAT1 to M-MAT4 produces a bit of data; i.e., the data of a total of four bits are produced simultaneously.

In this embodiment as shown in FIG. 2, furthermore, both the right and left sides of the semiconductor chip A are provided with pads $P_1$ to $P_{26}$ to which will be applied address signals $A_0$ to $A_{13}$, control signals $\overline{CS}$, $\overline{OE}$, $\overline{WE}$, and a predetermined operation voltage (power source voltage $V_{CC}$ and ground potential GND) for the electronic circuits, the pads $P_1$ to $P_{26}$ being arranged according to a predetermined order to correspond to the arrangement of pins. In this embodiment though not specifically limited, there are formed two pads for the power source voltage $V_{CC}$ and two pads for the ground potential GND among the above-mentioned pads $P_1$ to $P_{26}$, and voltages applied thereto are supplied to the chip as power source voltages $V_{CC1}$, $V_{CC2}$ and ground potentials $GND_1$, $GND_2$.

That is, connection pads $P_{12}$ and $P_{13}$ are provided for the ground potential GND, and connection pads $P_{25}$ and $P_{26}$ are provided for the power source voltage $V_{CC}$. Among the above-mentioned power source voltages, and power source voltages $GND_2$ and $V_{CC2}$ applied to the pads $P_{13}$, $P_{25}$ are supplied to the outputs buffer circuit DOB only.

On the other hand, the ground potential $GND_1$ and power source voltage $V_{CC1}$ applied to the pads $P_{12}$ and $P_{26}$ are supplied to the internal circuits such as the address buffers X-ADB1, X-ADB2, Y-ADB, the select circuits X-SEL1, X-SEL2, Y-SEL, and the decoders X-DEC1, X-DEC2, Y-DEC, except the above-mentioned output buffer DOB.

Therefore, even when the power source voltages $GND_2$ and $V_{CC2}$ are changed due to the operation of the output buffer DOB into which a relatively large current flows, the power source voltages $GND_1$ and $V_{CC1}$ are little affected, and the internal circuits are prevented from being erroneously operated.

Though not particularly limited, bonding wires are connected from common lead terminals to the two-split power source pads $P_{12}$, $P_{13}$ and $P_{25}$, $P_{26}$, so that power source voltages are applied thereto.

Figure 3:
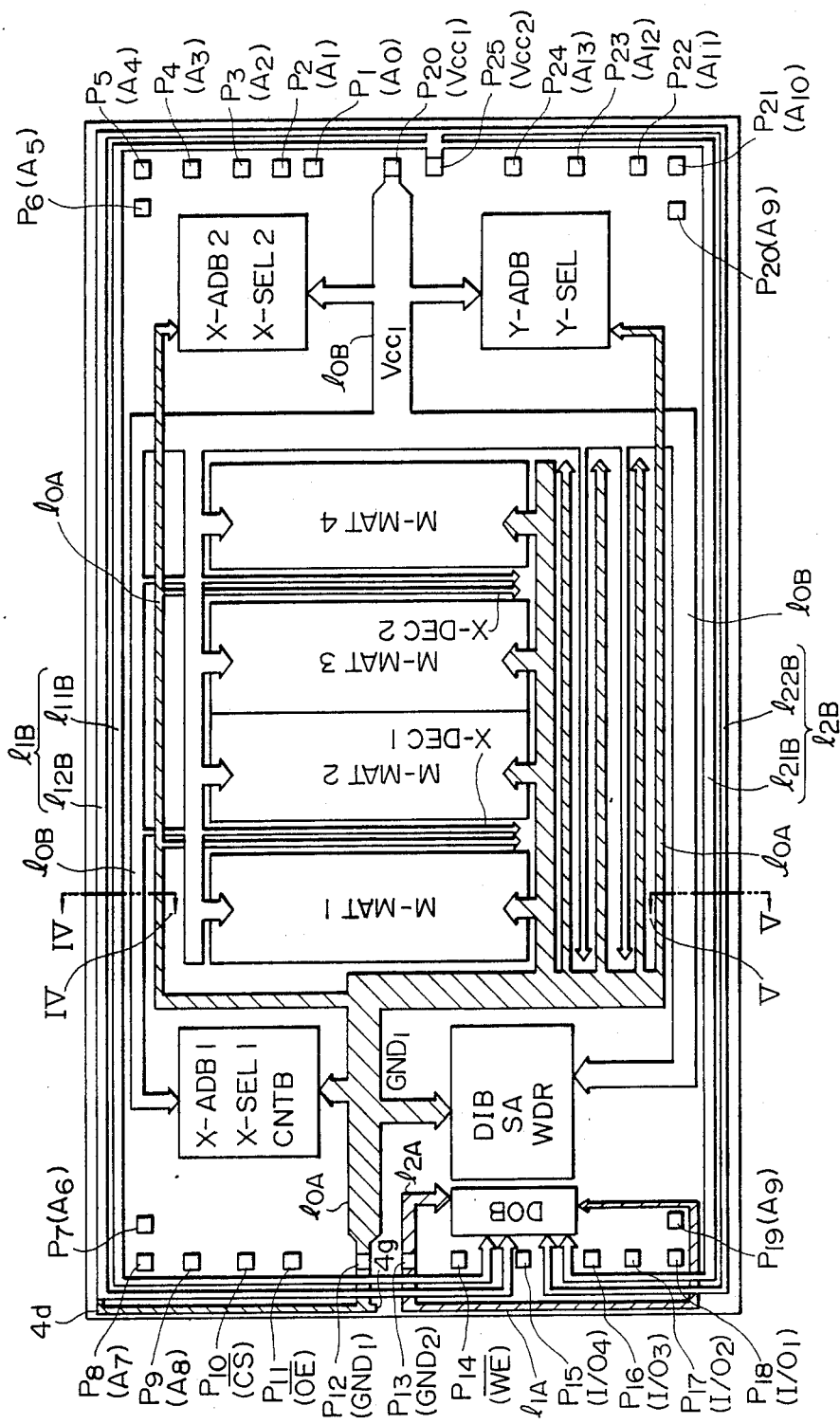
FIG. 3 is a diagram showing a power source wiring system according to an embodiment of the present invention.

FIG. 3 shows an embodiment of wiring system of power source lines for the circuit blocks on the semiconductor chip.

In this embodiment, the ground potential $GND_1$ applied to the pad $P_{12}$ and the power source voltage $V_{CC1}$ applied to the pad $P_{26}$ are supplied to the address buffers X-ADB1, X-ADB2, Y-ADB, select circuits X-SEL1, X-SEL2, Y-SEL, input buffer circuits CNTB, DIB that receive control signals and data signals, sense amplifier SA, and write driver WDR, via power source lines $l_{OA}$ and $l_{OB}$ that are arranged on the inner side of the semiconductor chip. The power source lines $l_{OA}$ and $l_{OB}$, which are the second wiring layers, are branched as they extend from one side to the other opposing side of the chip, in order to supply the power source voltages to each of the circuit blocks. Though not diagramed, each of the lines constitutes an AC loop.

The ground potential $GND_2$ applied to the power source pad $P_{13}$ is supplied to the output buffer DOB via a power source line (ground line) $l_{1A}$ which is a first path that is arranged along the outermost edge of the chip outside the pads $P_{14}$ to $P_{19}$ and a power source line (ground line) $l_{2A}$ which is a second path that is arranged from the pad $P_{13}$ toward the inside of the chip, the power source lines $l_{1A}$ and $l_{2A}$ being branched into two from the pad $P_{13}$ as shown in FIG. 3.

The power source voltage $V_{CC2}$ applied to the power source pad $P_{25}$ is supplied to the output buffer DOB via power source lines ($V_{CC}$ lines) $l_{1B}$ and $l_{2B}$ which are the first and second paths arranged along the outermost edge of the chip on the outside of the pads $P_1$ to $P_{14}$ and $P_{16}$ to $P_{24}$, the power source lines $l_{1B}$ and $l_{2B}$ being branched into two from the pad $P_{25}$. In this case, the invention shown in FIG. 1(B) is adapted to the above-mentioned portion.

Mutual inductances between the power source lines $l_{1A}$ and $l_{2A}$, and between the power source lines $l_{1B}$ and $l_{2B}$ can be regarded to be almost zero, since the power source voltages are supplied to the output buffer DOB via the power source lines $l_{1A}$, $l_{2A}$, $l_{1B}$ and $l_{2B}$ that are divided into two from the power source pads, and that are arranged so as to be separated from each other. Accordingly, the inductance as a whole can nearly be halved compared with when the power source voltage is supplied through a single power source line, and the power source voltages $GND_2$ and $V_{CC2}$ are prevented from changing even when the output buffer DOB is operated thereby allowing the flow of a large current.

Among the power source lines connected to the output buffer DOB, each of the $V_{CC}$ lines $l_{1B}$ and $l_{2B}$ is divided into two, i.e., divided into $l_{11B}$, $l_{12B}$ and $l_{21B}$, $l_{22B}$ that stretch up to the output buffer DO in parallel along the outer edge of the chip.

The output buffer DOB has four p-channel MOSFETs to send external output signals to the external output terminals $P_{15}$ to $P_{18}$. The $V_{CC}$ lines $l_{11B}$, $l_{12B}$, $l_{21B}$ and $l_{22B}$ supply power source voltages to the p-channel MOSFETs. By utilizing the double-layer aluminum wiring technique, branches of the power source lines $l_{OA}$, $l_{OB}$, which are the second wiring layers, are interposed between the $V_{CC}$ lines $l_{11B}$ and $l_{12B}$, and between the $V_{CC}$ lines $l_{21B}$ and $l_{22B}$. The invention shown in FIG. 1(D) is adapted to this portion. The power source voltage is prevented from changing even when external output signals of the same phase are produced.

The inventions of FIGS. 1(C), 1(D) and 1(E) are adapted when the output buffer circuit contains the two output p-channel MOSFETs.

Figure 4:
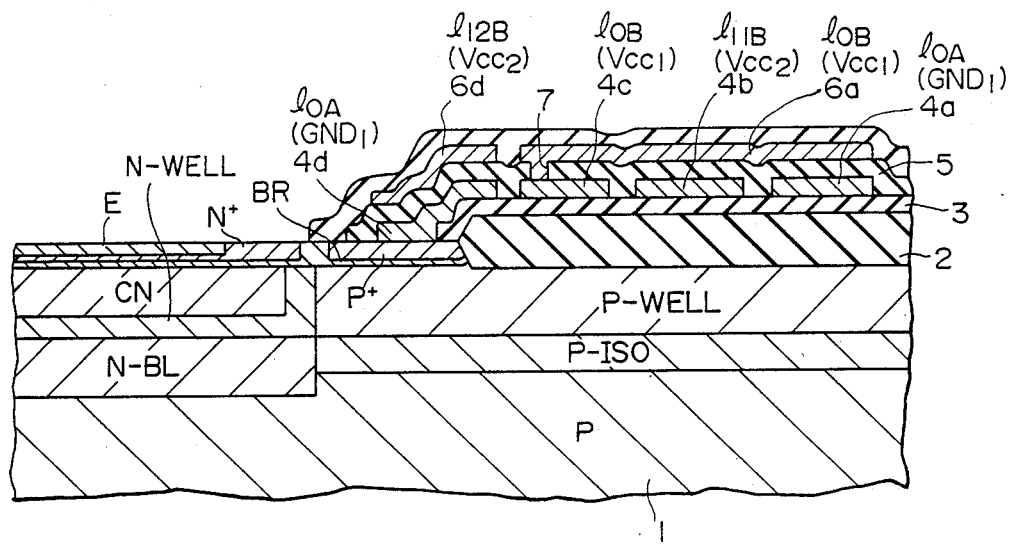
FIG. 4 is a section view along the live IV—IV of FIG. 3.
Figure 5:
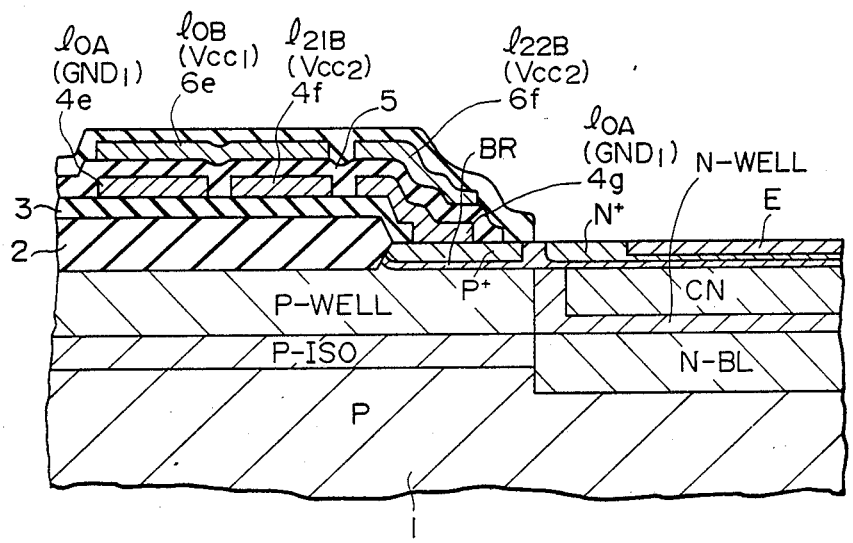
FIG. 5 is a section view along the line V—V of FIG. 3.

FIG. 4 is a section view along the line IV—IV of FIG. 3, FIG. 5 is a section view along the line V—V of FIG. 3.

The structure of FIG. 4 will be described, first.

First aluminum layers 4a, 4b, 4c and 4d, that serve as ground lines and $V_{CC}$ lines, are formed on a relatively thick selectively oxidized film 2 called LOCOS that is formed on the main surface of a semiconductor substrate 1 such as p-type single crystalline silicon, and on a first intermediate film 3 which is composed of a gate oxide film for the MISFET, a silicon oxide film formed by the CVD method (chemical vapor deposition method), a phosphosilicate glass film, or a silicon oxide film formed by the spin-on-glass method on the selectively oxidized film 2, the first aluminum layers running onto the main surface of the semiconductor substrate that forms wiring lines of the outer side.

Among them, the aluminum layers 4a and 4c constitute the AC loops and work as ground line $l_{OA}$ and $V_{CC}$ line $l_{OB}$ to supply the ground potential $GND_1$ and power source voltage $V_{CC1}$ to the internal circuits. The aluminum layer 4b works as power source line $l_{11B}$ to supply the power source voltage $V_{CC2}$ to the output buffer DOB, and the aluminum layer 4d works as ground line to apply a substrate potential. The ground line 4d forms the AC loop and of which one end is connected to the power source pad $P_{12}$ of FIG. 3. The ground line 4d is arranged along the whole outer edge of the chip, and is continuous to the main surface of the semiconductor substrate that forms a scribe line, and is partly contacted to the main surface of the semiconductor substrate to apply ground potential to the substrate. The ground line 4d further prevents the substrate potential from rising. Moreover, the ground potential supplied via the ground line 4d is applied to an input protecting element (not shown) that is provided near each of the pads via the substrate. Further, the ground line which is in contact with the entire periphery of the substrate protects the interior of chip from the external contamination.

On the first aluminum layers 4a and 4b are formed second aluminum layers 6a, 6d via a second intermediate insulating film 5 which consists of three layers, i.e., which consists of a silicon oxide film formed by the plasma CVD method, a silicon oxide film formed by the spin-on-glass method, and a phosphosilicate glass formed by the CVD method.

On the aluminum layers 6a and 6d is formed a passivation film composed of a silicon oxide film or a silicon nitride film formed by the plasma CVD method.

The aluminum layer 6a forms a closed loop structure and works as the $V_{CC}$ line $l_{OB}$ to supply the power source voltage $V_{CC1}$ to the internal circuits, and the aluminum layer 6d works as a second power source line $l_{12B}$ to supply the power source voltage $V_{CC2}$ to the output buffer DOB. The aluminum layer 6a is connected to the first aluminum layer 4c via a through hole 7.

According to this embodiment, the two layers, i.e., the first and second aluminum layers 4b and 6d are used as $V_{CC}$ lines $l_{11B}$, $l_{12B}$ to supply the power source voltage $V_{CC2}$ to the output buffer DOB. Moreover, the aluminum layers 6a and 4c that are used as $V_{CC}$ lines to supply the power source voltage $V_{CC1}$ to the internal circuits, are connected together via the through hole 7, and are interposed between the $V_{CC}$ lines $l_{11B}$ and $l_{12B}$ so as to cover the upper portion of the aluminum layer 4b that serves as the $V_{CC}$ line $l_{11B}$.

The aluminum layers 6a and 4c work as magnetic shielding plates to shield the magnetic field formed around the aluminum layer 4b by the electric current that flows therethrough and to shield the magnetic field formed around the aluminum layer 6d, making it possible to decrease the mutual inductance produced by the mutual induction between the $V_{CC}$ line $l_{11B}$ and the $V_{CC}$ line $l_{12B}$ that supply the power source voltage $V_{CC2}$ to the output buffer. Further, since the aluminum layers 6a and 4c have an AC loop structure, the apparent self-inductance of the power source lines $l_{11B}$ and $l_{12B}$ can be decreased.

Therefore, as when the two $V_{CC}$ lines are arranged to be greatly separated away from each other, the inductance of the wiring can be markedly decreased compared with when the power source voltage ($V_{CC2}$) is supplied through a single line. Among the aluminum layers, the second aluminum layer 6a having a relatively large width may be formed so as to be divided into two with a slit formed at the central portion thereof in order to avoid the concentration of stress that will be produced by the pressure at the time of assembling (packaging).

In the wiring region on the side where pull-up MOSFETs are arranged as shown in FIG. 5, on the other hand, the power source line $l_{OA}$ is formed by a first aluminum layer 4e to supply ground potential GND to the internal circuits, and the $V_{CC}$ lines $l_{21B}$ and $l_{22B}$ are formed by the first aluminum layer 4f and by the second aluminum layer 6f to supply power source voltage $V_{CC2}$ to the output buffer.

The second aluminum layer 6e forms a power source line $l_{OB}$ to supply the power source voltage $V_{CC1}$ to the internal circuits. Further, in the outermost edge of the chip is formed a first aluminum layer 4g to come into contact with the main surface of the substrate which partly forms a scribe line to apply ground potential $GND_1$ to the substrate like the aforementioned aluminum layer 4d.

In this embodiment, the power source line $l_{OB}$ for supplying the power source voltage $V_{CC1}$ to the internal circuits is constituted by the first and second aluminum layers 6e, 4g as shown in FIG. 4, because of the width of the wiring region. Therefore, the effect for shielding the magnetic field is inferior to some extent to that of FIG. 4. Even in this embodiment, however, the aluminum layers 6e and 4g are interposed between the aluminum layers 4f and 6f that form $V_{CC}$ lines $l_{21B}$ and $l_{22B}$ to supply the power source voltage $V_{CC2}$ to the output buffer, so that magnetic fields formed around the $V_{CC}$ lines $l_{21B}$ and $l_{22B}$ are partly shielded. Therefore, the mutual inductance induced between the power source lines $l_{21B}$ and $l_{22B}$ decreases compared with when the power source voltage is supplied through a single line, and variation in the power source voltage decreases. Moreover, since the aluminum layers 6e and 4g constitute the AC loop structure, the power source lines $l_{21B}$ and $l_{22B}$ form decreased apparent self-inductances.

Here, the wiring region on the pull-up MOSFET side may be constructed in the same manner as that of FIG. 4 to further decrease the mutual inductance.

In FIGS. 4 and 5, symbol N-BL denotes an $N^+$-type buried layer, P-ISO denotes a $P^+$-type isolation region, P-WELL denotes a p-type well region, N-WELL denotes an n-type well region, symbols CN, BR and E denote a collector pull-up port, a base region and an emitter region of the bipolar transistors, and symbols $P^+$ and $N^+$ denote semiconductor regions that are formed simultaneously with the semiconductor regions that serve as source and drain regions of the p-channel MOSFET and the n-channel MOSFET.

Figure 6:
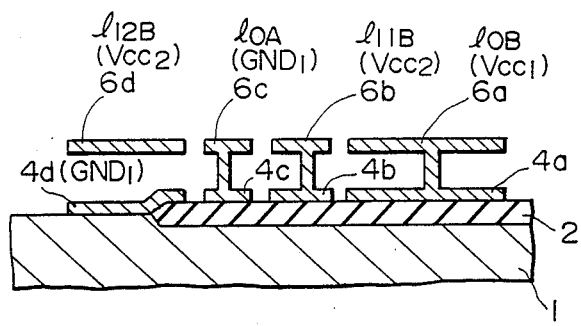
FIG. 6 is a section view which illustrates another embodiment of the present invention.
Figure 7:
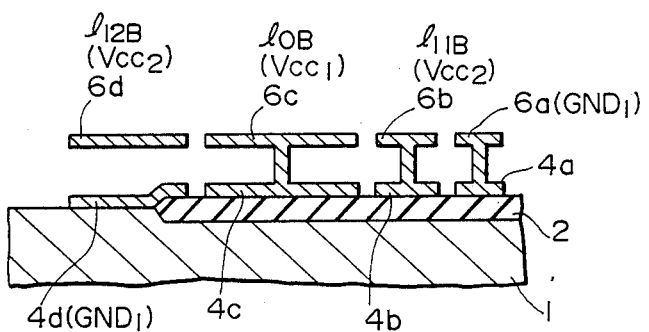
FIG. 7 is a section view which illustrates a further embodiment of the present invention.

FIGS. 6 and 7 are section views of the wiring region of FIG. 4 according to further embodiments.

In an embodiment of FIG. 6, the $V_{CC}$ line $l_{11B}$ (or $l_{21B}$) is constituted by a first aluminum layer 4b and a second aluminum layer 6b that are connected together to supply the power source voltage $V_{CC2}$ to the output buffer.

A first aluminum layer 4c and a second aluminum layer 6c that constitute a ground line $l_{OA}$ are interposed between the aluminum layers 4b, 6b and an aluminum layer 6d that forms the $V_{CC}$ line $l_{12B}$ ($l_{22B}$) which supplies power source voltage $V_{CC2}$ to the output buffer. The aluminum layers 4c and 6c work as magnetic shielding plates to shield the magnetic fields formed around the aluminum layers 4b, 6b that supply power source voltage $V_{CC2}$ to the output buffer and around the aluminum layer 6d. Therefore, the mutual inductance decreases between the $V_{CC}$ lines $l_{11B}$ and $l_{12B}$, and variation in the power source voltage $V_{CC2}$ decreases. Moreover, since the aluminum layers 4c and 6c form the AC loop structure, the power source lines 4b and 6b form decreased apparent self-inductance.

According to this embodiment, the first aluminum layer 4a and the second aluminum layer 6a connected together constitute a power source line $l_{OB}$ that supplies power source voltage $V_{CC1}$ to the internal circuits.

In an embodiment of FIG. 7, on the other hand, aluminum layers 4c and 6c that constitute a power source line $l_{OB}$ are interposed between aluminum layers 4b, 6b that constitute a $V_{CC}$ line $l_{11B}$ (or $l_{21B}$) and an aluminum layer 6d that constitutes a $V_{CC}$ line $l_{12B}$ (or $l_{22B}$). The aluminum layers 4c, 6c serve as magnetic shielding plates.

This embodiment is also effective to decrease the mutual inductions between the $V_{CC}$ lines $l_{11B}$ and $l_{12B}$ that supply power source voltage $V_{CC2}$ to the output buffer. Compared with the embodiment of FIG. 6, furthermore, the $V_{CC}$ lines $l_{11B}$ and $l_{12B}$ are separated from each other by a width of the aluminum layers 4c and 6c. Therefore, the mutual inductance can be decreased compared with that of FIG. 6. Further, since the aluminum layers 4c and 6c have an AC closed loop structure, the current lines $l_{11B}$ and $l_{12B}$ exhibit decreased apparent self-inductances.

The structure to interpose the aluminum layers that work as magnetic shielding plates between the $V_{CC}$ lines $l_{11B}$ and $l_{12B}$ (or between $l_{21B}$ and $l_{22B}$) that supply power source voltage $V_{CC2}$ to the output buffer circuit, should not be limited to the embodiments of FIGS. 4 to 7 only, but may be modified in a variety of ways.

The above-mentioned embodiments have dealt with the cases where the invention was adapted to the static RAM which utilized the double-layer aluminum wiring technology. By utilizing the triple-layer aluminum wiring technology, furthermore, the self-inductance and the mutual inductance can be further decreased.

In the foregoing was described the invention accomplished by the inventor by way of embodiments. The invention, however, should in no way be limited to the above-mentioned embodiments only but may be modified in a variety of ways without departing from the spirit and scope of the invention. In the above-mentioned embodiments, for example, the power source line for supplying power source voltage $V_{CC2}$ to the output buffer was divided into $l_{1B}$ and $l_{2B}$ near the pad. The power source line, however, may not be divided.

Further, the embodiments have dealt with the cases where the invention was adapted to the power source line that supplies power source voltage $V_{CC}$ to the output buffer. However, similar structure may also be applied to power source lines that supply power source voltage to other circuits. In the above-mentioned embodiments, furthermore, the power source pads for the output buffer were separated from those pads for other circuits. The power source lines, however, may be drawn from the common pads.

Furthermore, the transistors in the output stage need not be limited to MISFETS but may be bipolar transistors having an emitter size greater than that of the bipolar transistors used in the internal circuits.

The foregoing description as chiefly dealt with the case where the invention accomplished by the inventor was adapted to the static RAM consisting of bipolar transistors and MOSFETs formed on the same chip. The invention, however, can also be adapted to even a power source wiring system for general semiconductor integrated circuits and for printed substrates.

Described below are the effects of the invention.

(1) The wiring layer for supplying a predetermined operation voltage to an electronic circuit is divided into a first path and a second path which stretch in parallel with each other between a connection pad and the electronic circuit. Therefore, the self-inductance of the wiring as a whole can be decreased since it varies in inverse proportion to the sum of inverse numbers of self-inductances that are parasitic on the first and second paths.

(2) The second wiring layer is formed to constitute an AC loop near the first wiring layer which supplies a predetermined operation voltage to the electronic circuit. Therefore, a current flows in the AC loop, the current being nearly equal to the current that flows through the first wiring layer but having an opposite flowing direction thereto. Since these currents generate magnetic fields in the opposite directions, the magnetic flux that intersect the first wiring layer can be greatly reduced, and the apparent self-inductance of the first wiring layer can be decreased.

(3) Combination of the above-mentioned facts (1) and (2) helps decrease the self-inductance, mutual inductance and apparent self-inductance of the wiring layer. In addition, since the second wiring layer is provided between the first path and the third path (or between the second path and the third path) so that it works as a magnetic shielding member, the magnetic field can be shielded between the first path and the third path (or between the second path and the third path) and whereby the mutual inductance can be decreased between the first path and the third path (or between the second path and the third path).

(4) Owing to the above-mentioned fact (3), the parasitic impedance of the wiring layer which supplies operation voltage to the electronic circuit can be decreased, and variation is the operation voltage can be decreased.

(5) Owing to the above-mentioned fact (4), the operation voltage does not change even when the electronic circuit is operated, and the internal circuits can be prevented from erroneously operating.

(6) Since the internal circuits can be prevented from erroneously operating as described in (5) above, the semiconductor integrated circuit device exhibits improved reliability.

What is claimed is:

1. A semiconductor integrated circuit device comprising:
an electronic circuit which includes an output section having at least a pair of output stage circuits, each one being separately supplied with a predetermined operation voltage from a voltage supply connection pad, said predetermined operation voltage being substantially of the same amplitude for each one of said at least a pair of output stage circuits; and
wiring layer means formed on the main surface of a semiconductor substrate of said semiconductor integrated circuit device to separately supply said predetermined operation voltage to each one of said at least a pair of output stage circuits of said electronic circuit;
wherein said wiring layer means is comprised of at least a first path and a second path respectively connected along opposite sides near the periphery of said substrate from said voltage supply connection pad which is located near one end on said substrate to individual ones of said at least a pair of output stage circuits of said electronic circuit output section which is located near an opposite end on said semiconductor substrate.

2. A semiconductor integrated circuit device according to claim 1, wherein said electronic circuit performs a switching operation in response to input signals thereat.

3. A semiconductor integrated circuit device according to claim 2, further comprising:
an internal circuit formed on the main surface of said semiconductor substrate and being powered by a predetermined operation voltage of a different amplitude than that for said at least a pair of output stage circuits;
wherein said output stage circuits of said electronic circuit are comprised of means for providing respective external output signals to individual external output terminals associated therewith of said semiconductor integrated circuit device in response to input signals of said electronic circuit, and wherein at least one of said electronic circuit input signals is responsive to an output signal of said internal circuit.

4. A semiconductor integrated circuit device according to claim 3, wherein each one of said output stage circuits comprises an output transistor arrangement that generates said external output signal and which includes a pair of series-connected transistors having a size greater than that of other transistors in said internal circuit or elsewhere in said output stage circuit.

5. A semiconductor integrated circuit device according to claim 4, wherein each one of said series-connected transistors that generates said external output signal is a MOSFET.

6. A semiconductor integrated circuit device according to claim 5, wherein said electronic circuit further comprises a drive circuit for driving said pair of series connected MOSFETs, said drive circuit having an output portion including first and second pairs of series-connected bipolar transistors respectively coupled to the gate electrode of said MOSFETs.

7. A semiconductor integrated circuit device according to claim 6, wherein said drive circuit further comprises first and second CMOS circuits each having an output respectively coupled to drive said first and second pairs of series-connected bipolar transistors in a complementary manner, wherein said first CMOS circuit is arranged with said first pair of series-connected bipolar transistors to effect a NAND logic operation and said second CMOS circuit is arranged with said second pair of series-connected bipolar transistors to effect a NOR logic operation such that said series-connected pair of MOSFETs operates in a complementary switching manner.

8. A semiconductor integrated circuit device according to any one of claims 1 to 6, wherein said first path and said second path of said wiring layer means are formed on the main surface of a square semiconductor substrate adjacent the periphery along the four sides thereof.

9. A semiconductor integrated circuit device comprising:
an electronic circuit which includes an output section having at least a pair of output stage circuits, each one being separately supplied with a first predetermined operation voltage from a voltage supply connection pad;
a first wiring layer formed on the main surface of a semiconductor substrate of said semiconductor integrated circuit device to separately supply said first predetermined operation voltage to each one of said at least a pair of output stage circuits of said electronic circuit, wherein said first wiring layer is comprised of at least a first path and a second path respectively connected along opposite sides near the periphery of said substrate from said voltage supply connection pad which is located near the periphery of one side of a four-sided semiconductor substrate to said output section of said electronic circuit which is located near the periphery of an opposite side thereof; and
a second wiring layer formed on the main surface of said semiconductor substrate which includes wirings respectively disposed in close proximity with respect to the individual wiring paths which supply said first predetermined operation voltage close to said first wiring layer;
wherein said second wiring layer forms an AC loop.

10. A semiconductor integrated circuit device according to claim 9, wherein said electronic circuit performs a switching operation in response to input signals thereat.

11. A semiconductor integrated circuit device according to claim 10, further comprising:
an internal circuit formed on the main surface of said semiconductor substrate and being powered by a second operating voltage, different than said first operating voltage;
wherein said output stage circuits of said electronic circuit are comprised of means for providing respective external output signals to individual external output terminals associated therewith of said semiconductor integrated circuit device in response to input signals of said electronic circuit, and wherein at least one of said electronic circuit input signals is responsive to an output signal of said internal circuit.

12. A semiconductor integrated circuit device according to claim 11, wherein each one of said output stage circuits comprises an output transistor arrangement that generates said external output signal and which includes a pair of series-connected transistors having a size greater than that of other transistors in said internal circuit or elsewhere in said output stage circuit.

13. A semiconductor integrated circuit device according to claim 12, wherein each one of said series-connected transistors that generates said external output signal is a MOSFET.

14. A semiconductor integrated circuit device according to claim 13, wherein said electronic circuit further comprises a drive circuit for driving said pair of series-connected MOSFETs, said drive circuit having an output portion including respective pairs of series-connected bipolar transistors coupled to the gate electrode of said MOSFETs.

15. A semiconductor integrated circuit device according to claim 14, wherein said drive circuit further comprises a pair of CMOS circuits each having an output coupled to drive a respective pair of said series-connected bipolar transistors in a complementary manner, wherein a first of said CMOS circuits is arranged with a first of said pairs of series-connected bipolar transistors to effect a NAND logic operation and a second of said CMOS circuits is arranged with a second of said pairs of series-connected bipolar transistors to effect a NOR logic operation so that said series-connected pair of MOSFETs operate in a complementary switching manner.

16. A semiconductor integrated circuit device according to any one of said claims 9 to 14 wherein said first path and said second path of said first wiring layer are formed on the main surface of a square semiconductor substrate along the four sides thereof.

17. A semiconductor integrated circuit device according to claim 9, wherein part of said first wiring layer and part of said second wiring layer are at least solidly laminated.

18. A semiconductor integrated circuit device according to any one of claims 1 to 3, wherein said electronic circuit comprises four output stage circuits, each one being comprised of a bipolar transistor series-coupled with a MOSFET between a separate wiring path for supplying said predetermined operation voltage and reference potential, and which are disposed on said semiconductor substrate adjacent to external output pads; and
wherein said wiring layer means comprises first and second pairs of conductor paths, said first pair being divided into first and second conductor paths and said second pair being divided into third and fourth conductor paths, wherein said first and third conductor paths and said second and fourth conductor paths are respectively in parallel and wherein said first and third conductor paths and said second and fourth conductor paths extend from a voltage supply connection pad located on one side of said substrate along respectively opposite sides of said substrate near the peripheries thereof to the respective output stage circuits.

19. A semiconductor integrated circuit device according to claim 18, wherein said wiring layer means further comprises magnetic shielding plate means for effecting mutual inductance isolation between said first and third conductor paths and between said second and fourth conductor paths, respectively.

20. A semiconductor integrate circuit device according to any one of claims 9 to 11, wherein said electronic circuit comprises four output stage circuits, each one being comprised of a bipolara transistor series-coupled with a MOSFET between a separate wiring path for supplying said predetermined operation voltage and reference potential, and which are disposed on said semiconductor substrate adjacent to external output pads; and
wherein said first wiring layer comprises first and second pairs of conductor paths, said first pair being divided into first and second conductor paths and said second pair being divided into third and fourth conductor paths, wherein said first and third conductor paths and said second and fourth conductor paths are respectively in parallel and wherein said first and third conductor paths and said second and fourth conductor paths extend from a voltage supply connection pad located on one side of said substrate along respectively opposite sides of said substrate near the peripheries thereof to the respective output stage circuits.

21. A semiconductor integrated circuit device according to claim 20, wherein said second wiring layer further comprises magnetic shielding plate means for effecting mutual inductance isolation between said first and third conductor paths and between said second and fourth conductor paths, respectively.

22. A wiring arrangement for a semiconductor integrated circuit device formed on a main surface of a rectangular-shaped semiconductor substrate including an electronic circuit disposed near the periphery of one side of said semiconductor substrate and which includes an output section having at least a pair of output stage circuits for providing at least a pair of external output signals at corresponding external output pads, wherein each output stage circuit is separately supplied with a first predetermined operation voltage from a voltage supply connection pad, comprising:
a voltage supply pad disposed near the periphery on an opposite side of said semiconductor substrate from where said electronic circuit is disposed for providing said predetermined operation voltage; and
at least one wiring layer for separately providing said first predetermined operation voltage to each one of said output stage circuits when power is applied to said voltage supply pad, said wiring layer being divided into at least a pair of separated current paths extending along opposite regions and near the peripheries of the remaining two sides of said rectangular-shaped semiconductor substrate between said voltage supply pad and respective supply terminals of said output stage circuits thereby preventing any adverse changes in the predetermined operation voltage by effectively reducing the parasitic self-inductance of the conductor pairs and avoiding mutual inductance thereat.

23. A semiconductor integrated circuit device according to claim 22, wherein said electronic circuit includes four output stage circuits each one being supplied via a separate wiring current path of a first wiring layer which has two pairs of separate current path wirings extending along opposite regions and near the peripheries of said substrate from said voltage supply pad to supply terminals associated with said four output stage circuits.

24. A semiconductor integrated circuit device according to claim 22, said electronic circuit includes four output stage circuits and wherein said at least one wiring layer includes a first wiring layer and a second wiring layer, said first wiring layer including a first wiring path split into first and second conductor paths and a second wiring path split into third and fourth conductor paths, wherein said first and third conductor paths and said second and fourth conductor paths are respectively in parallel and wherein said first and third conductor paths and said second and fourth conductor paths extend from said power supply connection pad along respectively opposite sides of said substrate near the peripheries thereof to the respective supply terminals of said four output stage circuits.

25. A semiconductor integrated circuit device according to claim 24, further comprising a second wiring layer consisting of magnetic shielding plate means for effecting mutual inductance isolation between said first and third conductor paths and between said second and fourth conductor paths, respectively.

26. A semiconductor integrated circuit device according to claim 24, wherein said rectangular-shaped semiconductor substrate in a square semiconductor substrate.

27. A semiconductor integrated circuit device according to claim 25, wherein said rectangular-shaped semiconductor substrate is a square semiconductor substrate.

28. A semiconductor integrated circuit device according to claim 7, wherein said pair of series-connected MOSFETs are of the complementary channel type.

29. A semiconductor integrated circuit device according to claim 15, wherein said pair of series-connected MOSFETs are of the complementary channel type.

30. A semiconductor integrated circuit device according to claim 18, wherein each one of said four output stage circuits is comprised of an NPN bipolar transistor having a collector coupled to a wiring path for receiving said predetermined operation voltage, an emitter coupled via a diode junction to the drain of an N-channel MOSFET which has its source coupled to a reference ground potential, and wherein the base of said NPN bipolar transistor and the gate of said MOSFET are responsive to complementary signals in accordance with incoming signals of said electronic circuit.

31. A semiconductor integrated circuit device according to claim 20, wherein each one of said four output stage circuits is comprised of an NPN bipolar transistor having a collector coupled to a wiring path for receiving said predetermined operation voltage, an emitter coupled via a diode junction to the drain of an N-channel MOSFET which has its source coupled to a reference ground potential, and wherein the base of said NPN bipolar transistor and the gate of said MOSFET are responsive to complementary signals in accordance with incoming signals of said electronic circuit.

32. A semiconductor integrated circuit device according to claim 24, wherein each one of said four output stage circuits is comprised of an NPN bipolar transistor having a collector coupled to a wiring path for receiving said predetermined operation voltage, an emitter coupled via a diode junction to the drain of an N-channel MOSFET which has its source coupled to a reference ground potential, and wherein the base of said NPN bipolar transistor and the gate of said MOSFET are responsive to complementary signals in accordance with incoming signals of said electronic circuit.

* * * * *